US012726190B2

(12) United States Patent
Kutej et al.

(10) Patent No.: US 12,726,190 B2
(45) Date of Patent: Sep. 1, 2026

(54) INPUT OFFSET COMPENSATION FOR A COMPARATOR CIRCUIT

(71) Applicant: SEMICONDUCTOR COMPONENTS INDUSTRIES, LLC, Scottsdale, AZ (US)

(72) Inventors: Jiri Kutej, Brno (CZ); Pavel Horsky, Brno (CZ); Jan Plojhar, Mokra Horakov (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 70 days.

(21) Appl. No.: 19/028,795

(22) Filed: Jan. 17, 2025

(65) Prior Publication Data

US 2026/0213741 A1 Jul. 23, 2026

(51) Int. Cl.
*H03K 5/24* (2006.01)
*G01R 19/00* (2006.01)

(52) U.S. Cl.
CPC ....... *H03K 5/2481* (2013.01); *G01R 19/0038* (2013.01); *H03K 5/249* (2013.01)

(58) Field of Classification Search
CPC ........... H03K 5/24; H03K 5/2472–249; G01R 19/0038
See application file for complete search history.

(56) References Cited

U.S. PATENT DOCUMENTS

2006/0279353 A1 12/2006 Atrash et al.
2007/0019450 A1 1/2007 Tiew
(Continued)

FOREIGN PATENT DOCUMENTS

EP 2573575 B1 4/2016
EP 3965301 A1 9/2022

OTHER PUBLICATIONS

Chong-Gun Yu and R. L. Geiger, "An automatic offset compensation scheme with ping-pong control for CMOS operational amplifiers," in IEEE Journal of Solid-State Circuits, vol. 29, No. 5, pp. 601-610, May 1994 (Year: 1994).*
(Continued)

*Primary Examiner* — Patrick O'Neill
(74) *Attorney, Agent, or Firm* — Slayden Grubert Beard PLLC

(57) ABSTRACT

A comparator circuit is disclosed. The comparator circuit includes a comparator with a first input terminal configured to receive a first input signal, a second input terminal configured to receive a second input signal, a chopper circuit configured to alternate an input polarity of an input stage during a first phase and a second phase. The comparator circuit further includes a counter circuit coupled to receive a comparator-output signal and a clock signal, the counter circuit configured to generate a first count during the first phase and to generate a second count during the second phase based on the comparator-output signal and the clock signal. The comparator circuit further includes a compensation circuit configured to generate an offset-compensation signal based on the first count and the second count. The comparator further includes an offset controller configured to adjust an input offset of the comparator based on the offset-compensation signal.

20 Claims, 7 Drawing Sheets

(56) References Cited

U.S. PATENT DOCUMENTS

2009/0243663 A1* 10/2009 Chalamala .......... H03F 3/45596 327/67
2009/0284242 A1 11/2009 Motz
2013/0049723 A1 2/2013 Latham
2015/0207405 A1* 7/2015 Agarwal ................. H03M 1/70 327/306
2018/0091103 A1 3/2018 Stan et al.
2019/0253650 A1* 8/2019 Kim ..................... H04N 25/772
2020/0313553 A1 10/2020 Horsky
2021/0160985 A1 5/2021 Eggermont
2024/0333162 A1 10/2024 Aoki
2024/0410920 A1 12/2024 Lin
2025/0220792 A1 7/2025 Horsky
2026/0088810 A1* 3/2026 Yano ...................... H03K 5/249

OTHER PUBLICATIONS

G.Walter und G.Herms: “Einführung in die Behandlung von Messfehlern”; Universität Rostock 2006; 44 pages; English Summary included.

* cited by examiner

INPUT OFFSET COMPENSATION FOR A COMPARATOR CIRCUIT

TECHNICAL FIELD

The disclosure relates generally to integrated circuit technology, and particularly to offset compensation for comparator circuits.

BACKGROUND

Comparators may be used in various semiconductor-based electronic circuits to compare a first input voltage against a second input voltage. Comparator circuits may include an input stage that amplifies the difference between the first input voltage and the second input voltage to generate an output indicative of which input voltage is larger.

The inventors of embodiments of the present disclosure have recognized that due to semiconductor process variation, the input stage of a comparator may have an input offset that may negatively affect the accuracy of the comparator. The inventors of embodiments of the present disclosure have also recognized that such an input offset may have a negative effect on the overall application in which the comparator is implemented, and particularly for applications where the ranges of the input voltages are small and thus the relative proportion of the offset to the signal range is large. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

DETAILED DESCRIPTION

Details of one or more embodiments are set forth in the description below and the accompanying drawings. Other features will be apparent from the description, drawings, and from the claims. The embodiments disclosed should not be interpreted, or otherwise used, as limiting the scope of the disclosure, including the claims. In addition, one skilled in the art understands that the following description has broad application, and the discussion of any embodiment is meant to be exemplary of that embodiment, and not intended to intimate that the scope of the disclosure, including the claims, is limited to that embodiment.

Various terms are used to refer to particular system components. Different companies may refer to a component by different names, and this disclosure does not intend to distinguish between components that differ in name but not form and function. In the following discussion and in the claims, the terms "including" and "comprising" are used in an open-ended fashion, and thus should be interpreted to mean "including, but not limited to." Also, the term "couple" or "coupled" is intended to mean either an indirect or direct connection. Thus, if a first device couples to, or is coupled to, a second device, that connection between the first device and the second device may be through a direct connection or through an indirect connection via other devices and connections.

Figure 1:
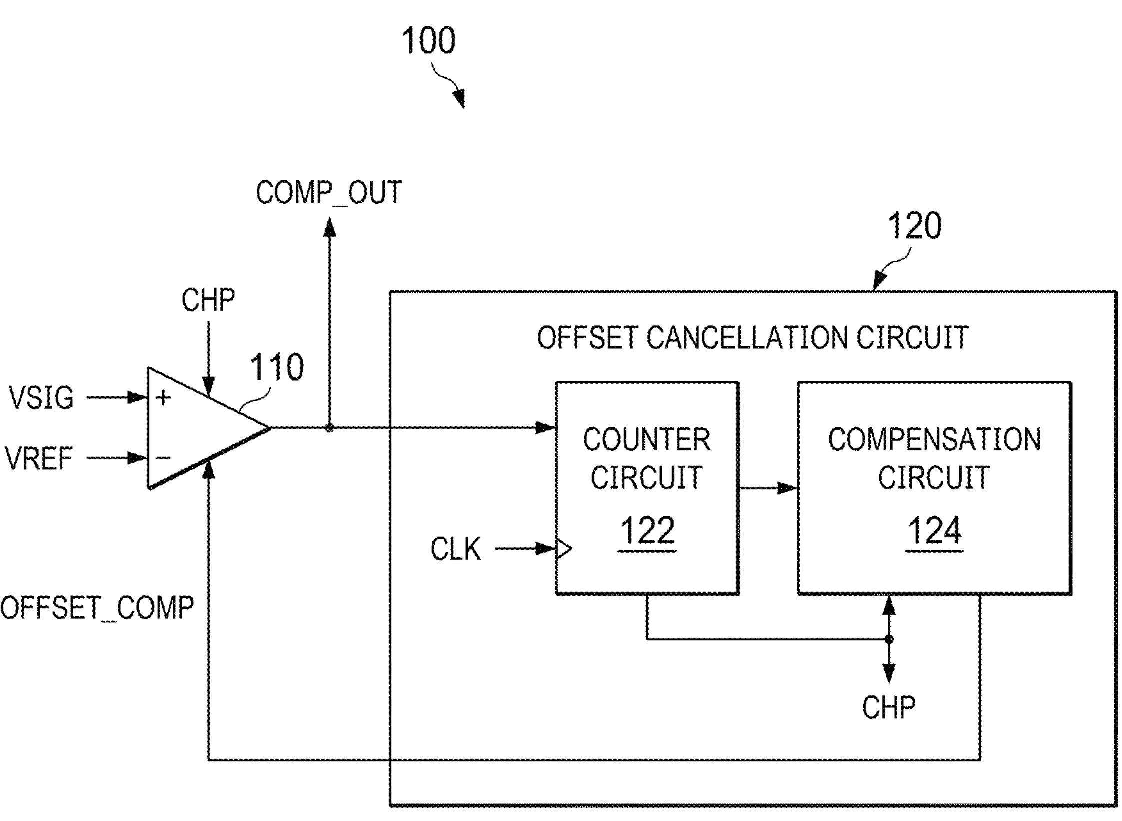
FIG. 1 illustrates a schematic diagram of a comparator circuit in accordance with embodiments of the present disclosure.

FIG. 1 illustrates a schematic diagram of comparator circuit 100 in accordance with embodiments of the present disclosure. Comparator circuit 100 may be implemented in any suitable fashion according to the operation described in the present disclosure. As described direction below, comparator circuit 100 may include circuitry for compensating the input offset of comparator 110 and may thus also be referred to as an offset-compensation system.

Comparator circuit 100 may include comparator 110 and offset cancellation circuit 120. Comparator 110 may be implemented in any suitable fashion according to the operation described in the present disclosure. Comparator 110 may include a first input terminal configured to receive a first input signal. Comparator 110 may also include a second input terminal configured to receive a second input signal. As shown in FIG. 1, comparator 110 may receive a first input signal in the form of input signal VSIG at its positive input terminal, and may receive a second input signal in the form of reference signal VREF at its negative input terminal. Comparator 110 may compare the first input signal and the second input signal to generate a comparator-output signal COMP_OUT. For example, when the first input signal such as VSIG is larger than the second input signal such as VREF, comparator 110 may drive COMP_OUT to a logic-high level. And when the first input signal such as VSIG is less than the second input signal such as VREF, comparator 110 may drive COMP_OUT to a logic-low level.

As shown in FIG. 1, comparator 110 may also receive a chopper signal CHP to control a chopper circuit internal to comparator 110. As described in further detail below with reference to FIGS. 3A-4B, the chopper circuit may be configured to alternate, during a first phase and a second phase, an input polarity of an input stage internal to comparator 110 as well as an output polarity of an output stage internal to comparator 110. Thus, any input offset present in comparator 110, due to semiconductor process variation for example, may have an equal or substantially equal magnitude and opposite polarity during the first and second phases. For example, if a −10 mV offset is present during the first phase when the chopper signal CHP is in a first state, a +10 mV offset may be present during the second phase when the chopper signal CHP is in a second state. As described directly below, offset cancellation circuit 120 may monitor the comparator-output signal COMP_OUT during the first phase and the second phase, and may generate an offset-compensation signal OFFSET_COMP that may be utilized to provide a coarse offset compensation for comparator 110.

In some embodiments, at least one of the first input signal and the second input signal may be a cyclic signal. The first phase and the second phase described above may have a phase frequency aligned to the cyclic frequency of the cyclic signal. Offset cancellation circuit 120 may thus utilize the cyclic nature of the of the inputs of comparator 110 to measure a magnitude of the offset present in comparator 110 and to generate an offset-compensation signal OFFSET_COMP accordingly. As described in further detail below with reference to FIGS. 3A-4B, comparator 110 may include an offset controller that may receive an offset-compensation signal OFFSET_COMP and may be configured to adjust the input offset of comparator 110 based on the offset-compensation signal OFFSET_COMP.

Offset cancellation circuit 120 may be implemented in any suitable fashion according to the operation described in the present disclosure. Offset cancellation circuit 120 may include counter circuit 122 and compensation circuit 124. As shown in FIG. 1, counter circuit 122 may be coupled to receive the comparator-output signal COMP_OUT and a clock signal CLK. In some embodiments, counter circuit 122 may be configured to generate a first count during the first phase, for example when CHP is high, based on the comparator-output signal COMP_OUT and the clock signal CLK. Likewise, counter circuit 122 may also be configured to generate a second count during the second phase, for example when CHP is low, based on the comparator-output signal COMP_OUT and the clock signal CLK.

Figure 2:
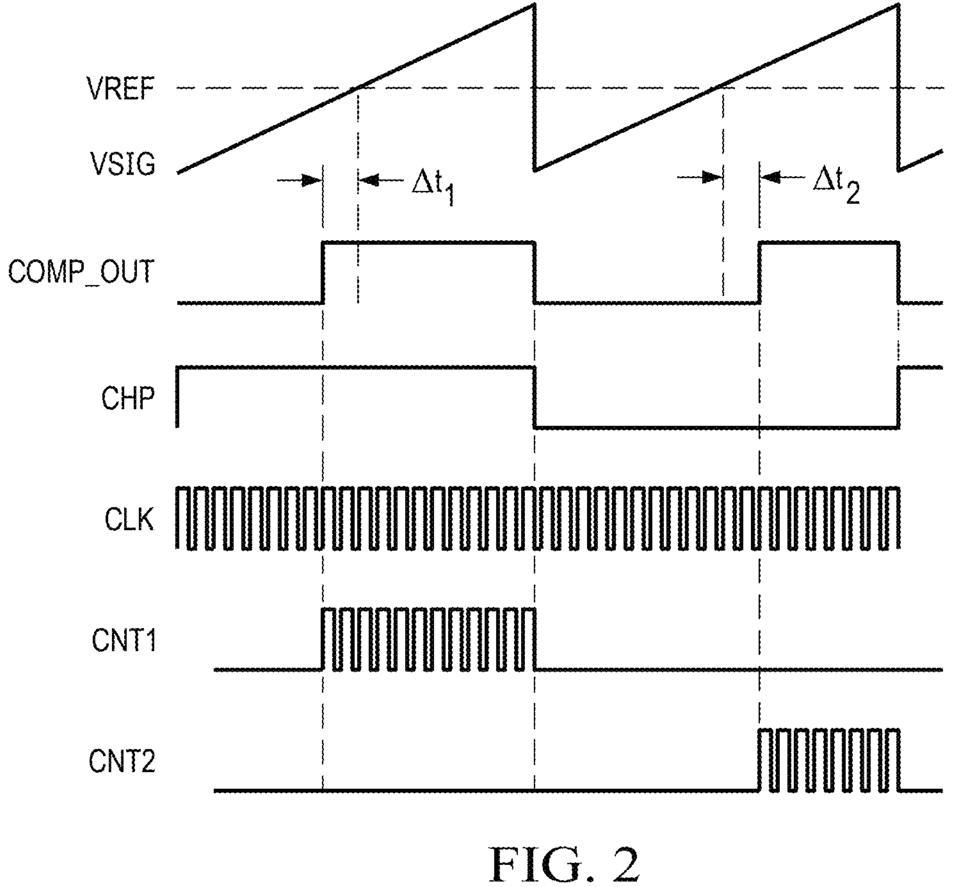
FIG. 2 illustrates a plot diagram of example waveforms within a comparator circuit in accordance with embodiments of the present disclosure.

FIG. 2 illustrates a plot diagram of example waveforms within comparator circuit 100 in accordance with embodiments of the present disclosure. As described above with reference to FIG. 1, comparator 110 may receive a first input signal in the form of input signal VSIG at its positive input terminal, and may receive a second input signal in the form of reference signal VREF at its negative input terminal. At least one of the first input signal and the second input signal may be a cyclic signal. For example, as shown in FIG. 2, VSIG may be a cyclic sawtooth signal. Although shown in FIG. 2 as a sawtooth signal, VSIG may in other embodiments take the form of any other cyclic signal. In some embodiments, VREF may be cyclic instead of, or in addition to, VSIG. As described above, the first phase and the second phase of the chopper signal CHP may have a phase frequency aligned to the cyclic frequency of the cyclic signal. For example, the chopper signal CHP controlling the phases of the comparator 110 may have a frequency that is half of the frequency of the cyclic input signal VSIG. Accordingly, the first phase and the second phase of comparator 110 may each align with a full cycle of the cyclic input signal VSIG.

Comparator 110 may compare the VREF and VSIG and generate the comparator-output signal COMP_OUT. The comparator-output signal COMP_OUT may have a logic-high state when VREF is greater than VSIG and a logic-low state when VREF is lower than VSIG. An input offset present in comparator 110 may induce an error around the transition point for the comparator-output signal COMP_OUT. For example, a positive input offset during the first phase when the chopper signal CHP is in a first state may induce COMP_OUT to transition from low to high before VSIG crosses from below to above the voltage level of VREF. As described above, the input offset of comparator 110 may have an equal or substantially equal magnitude and opposite polarity during the first and second phases. Thus, if a +10 mV offset is present during the first phase when the chopper signal CHP is in a first state, a −10 mV offset may be present during the second phase when the chopper signal CHP is in a second state. The negative input offset during the second phase may thus induce COMP_OUT to transition from low to high after VSIG crossed from below to above the voltage level of VREF. The early transition of COMP_OUT induced by the positive offset during the first phase is shown by a first time delta $\Delta t_1$. Likewise, the late transition of COMP_OUT induced by the negative offset during the second phase is shown by a second time delta $\Delta t_2$.

As described above with reference to FIG. 1, counter circuit 122 may be coupled to receive the comparator-output signal COMP_OUT and a clock signal CLK. In some embodiments, counter circuit 122 may be configured to generate a first count during the first phase when CHP is high based on the comparator-output signal COMP_OUT and the clock signal CLK. For example, counter circuit 122 may generate the first count during a first phase by counting the number of clock pulses during the time when COMP_OUT is high and CHP is high, as represented by CNT1 in FIG. 2. Counter circuit 122 may also generate the second count during the second phase by counting the number of clock pulses during the time when COMP_OUT is high and CHP is low, as represented by CNT2 in FIG. 2. As illustrated in FIG. 2, the clock signal CLK may have a clock frequency that is higher than a phase frequency of the first phase and the second phase. For example, to provide a high resolution for the first count and the second count, the clock signal CLK may have a clock frequency that is higher than a phase frequency of the first phase and the second phase by a ratio of a least 10:1, 20:1, 40:1, 100:1, 1000:1, or more.

As illustrated by FIG. 2, the first count and the second count may vary with respect to each other based on the input offset present in comparator 110. For example, a positive offset during the first phase may increase the number of clock pulses counted during the first phase, including during the first time delta $\Delta t_1$. Likewise, a negative offset during the second phase may decrease the number of clock pulses counted during the second phase, including during the second time delta $\Delta t_2$. Accordingly, the difference between the first count corresponding to the first phase and the second count corresponding to the second phase may be proportional to the input offset of comparator 110. Although the example illustrated in FIG. 2 contemplates a positive offset during the first phase and a negative offset during the second phase, a negative offset during the first phase and a positive offset during the second phase may cause a similar difference, with opposite polarity, between the first count and the second count.

Referring back to FIG. 1, compensation circuit 124 may be coupled to counter circuit 122. For example, compensation circuit 124 may be coupled to receive the first count and the second count from counter circuit 122. Compensation circuit 124 may also be configured to generate an offset-compensation signal OFFSET_COMP based on the first count and the second count. As described above with reference to FIG. 2, the difference between the first count and the second count may be proportional to the input offset of comparator 110. Thus, to compensate for the input offset of comparator 110, compensation circuit 124 may generate an offset-compensation signal OFFSET_COMP that may adjust the input offset of comparator 110 at a level that is proportional to the difference between the first count and the second count. Although the embodiment described with reference to FIG. 2 may utilize the logic-high portion of COMP_OUT to generate the first count CNT1 and the second count CNT2, the low-low portion of COMP_OUT may also be utilized in place of or in addition to the logic-high portion of COMP_OUT to generate counts proportional to the input offset of comparator 110.

In some embodiments and depending on the application in which comparator circuit 100 is implemented, the offset-compensation signal OFFSET_COMP may provide a coarse offset compensation for comparator 110 within comparator circuit 100. Continued operation of the chopper circuitry within comparator 110 may provide further cancellation of offset for applications that may utilize the aggregate of the first count and the second count over one or more phases. For example, the first count across two or more chopper phases may be averaged to generate a first-count average. Specifically, counter circuit 122 may be further configured to average the first count over two or more repeated first phases to generate a first-count average. Likewise, the second count over two or more chopper phases may be averaged to generate a second-count average. Specifically, counter circuit 122 may be further configured to average the second count over two or more repeated second phases to generate a second-count average. By averaging each of the first count and the second count over multiple chopper phases, the chopper operation may provide a further fine offset cancellation in addition to the coarse offset cancellation provided by off-compensation signal OFFSET_COMP.

In such embodiments, the amount of offset that is further cancelled by the chopper operation may be smaller after the coarse offset compensation provided by the offset-compensation signal OFFSET_COMP. Thus, noise associated with the chopper operation of comparator 110 may be reduced by the coarse offset compensation provided by the offset-compensation signal OFFSET_COMP.

In other applications, for example applications that may directly utilize the comparator-output signal COMP_OUT, continued chopper operation of comparator 110 may be of limited benefit after the coarse offset compensation from the offset-compensation signal OFFSET_COMP has been applied. Thus, to reduce or eliminate noise associated with continued chopper operation of comparator 110, comparator circuit 100 may be configured to disable chopping after setting the offset-compensation signal OFFSET_COMP.

Figure 3A:
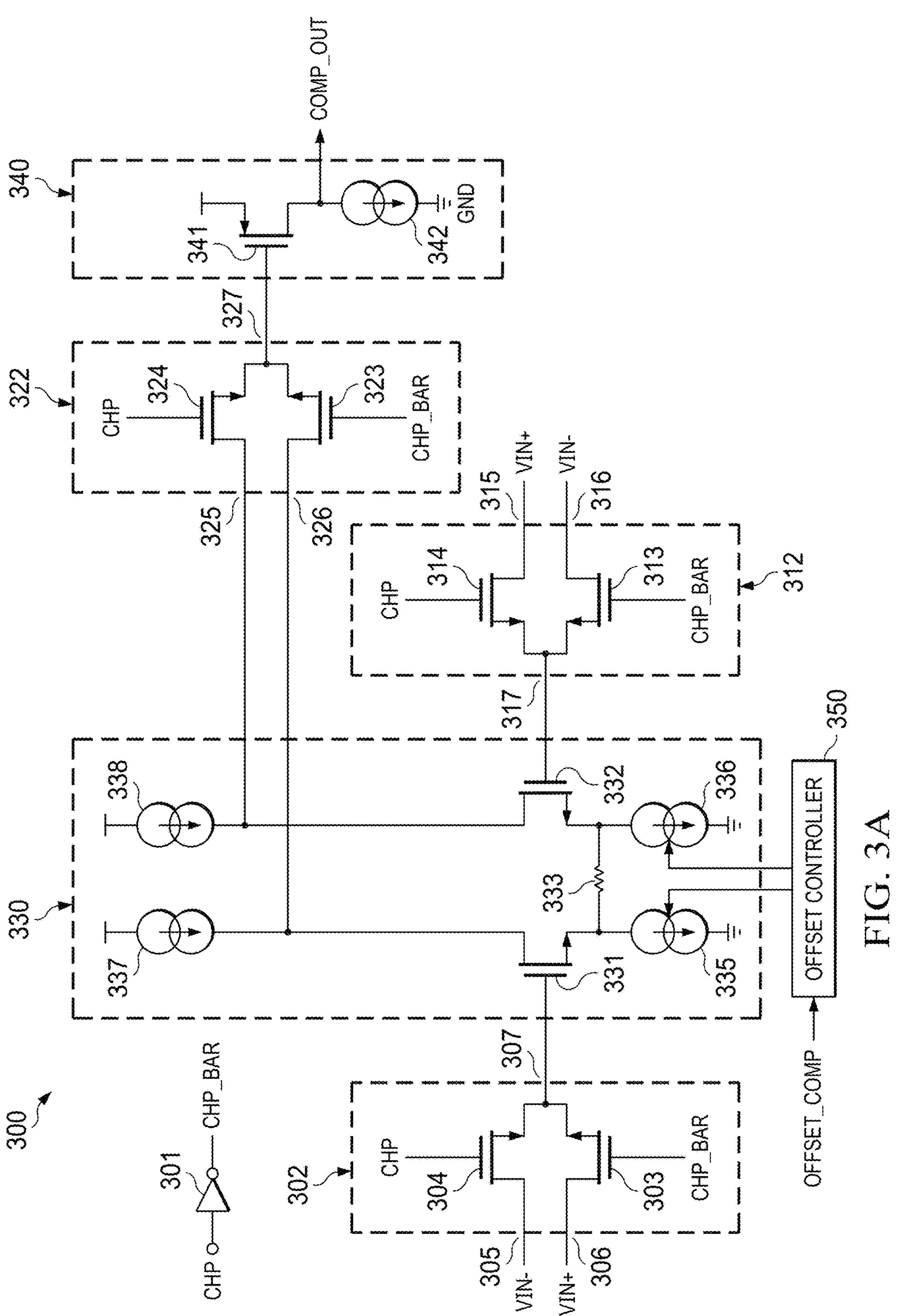
FIG. 3A illustrates a schematic diagram of a comparator in accordance with embodiments of the present disclosure.

FIG. 3A illustrates a schematic diagram of comparator 300 in accordance with embodiments of the present disclosure. Comparator 300 may represent an embodiment of comparator 110 in comparator circuit 100 described above with reference to FIG. 1. Comparator 300 may be implemented in any suitable fashion according to the operation described in the present disclosure. As shown in FIG. 3A, comparator 300 may include input stage 330, output stage 340, offset controller 350, and a chopper circuit collectively formed by pass gates 302, 312, and 322.

Input stage 330 may include first transistor 331 and second transistor 332 configured together as a differential pair. In some embodiments, first transistor 331 and second transistor 332 may be n-type metal-oxide semiconductor field-effect transistors ("n-type MOSFETs" or "NMOS transistors"). As shown in FIG. 3A, the source of first transistor 331 may be coupled to a first current source 335, and the source of second transistor 332 may be coupled to a second current source 336. Resistor 333 may be coupled between the respective sources of first transistor 331 and second transistor 332. Accordingly, and as described in further detail below with reference to offset controller 350, input offset compensation may be injected into input stage 330 based on the resistance value of resistor 333 and the difference between the bias currents provided by first current source 335 and second current source 336. Input stage 330 may further include current source 337 coupled to the drain of first transistor 331 and current source 338 coupled to the drain of second transistor 332. In some embodiments, the bias currents provided by current source 337 and current source 338 may match each other. For example, in some embodiments, current source 337 and current source 338 may be implemented by matching output branches of a current mirror such that the bias current provided by current source 337 matches the bias current provided by current source 338. With first transistor 331 and second transistor 332 being configured together as a differential pair, first transistor 331 and second transistor 332 may amplify any difference in voltage signals received at the respective gates of first transistor 331 and second transistor 332.

Output stage 340 may be coupled to input stage 330 and may be configured to generate the comparator-output signal COMP_OUT. Output stage 340 may include output transistor 341 and current source 342. In some embodiments, output transistor may be a p-type metal-oxide semiconductor field-effect transistor ("p-type MOSFET" or "PMOS transistor"). As shown in FIG. 3A, output transistor 341 may have a source coupled to a supply voltage and a drain coupled to current source 342. The gate of output transistor 341 may be coupled, via pass gate 322, to the drain of either first transistor 331 or second transistor 332 depending on the state of pass gate 322. Output stage 340, and output transistor 341 in particular, may thus further amplify the output of input stage 330. In some embodiments, output transistor 341 may generate the comparator-output signal COMP_OUT at its drain.

In addition to input stage 330 and output stage 340, comparator 300 may include a chopper circuit collectively formed by pass gates 302, 312, and 322. The chopper circuit may be configured to alternate an input polarity of input stage 330 during a first phase and a second phase of the chopper signal CHP. The chopper circuit may also be configured to alternate an output polarity of output stage 340 during the first phase and the second phase of the chopper signal CHP.

As shown in FIG. 3A, inverter 301 may invert the chopper signal CHP to create an additional inverse chopper signal CHP_BAR. Pass gates 302, 312, and 322 may utilize CHP and CHP_BAR to selectively pass a signal from one of two pass-gate inputs to the pass-gate output.

Pass gate 302 may include a first pass transistor 304 having a drain coupled to a first pass-gate input 305, a gate driven by the chopper signal CHP, and a source coupled to the pass-gate output 307. Pass gate 302 may also include a second pass transistor 303 having a drain coupled to a second pass-gate input 306, a gate driven by the inverse chopper signal CHP_BAR, and a source coupled to the pass-gate output 307. Pass gate 312 may be configured in a similar manner as pass gate 302. For example, pass gate 312 may include a first pass transistor 314 having a drain coupled to a first pass-gate input 315, a gate driven by the chopper signal CHP, and a source coupled to the pass-gate output 317. Pass gate 312 may also include a second pass transistor 313 having a drain coupled to a second pass-gate input 316, a gate driven by the inverse chopper signal CHP_BAR, and a source coupled to the pass-gate output 317. Pass gate 322 may also be configured in a similar manner as pass gate 302 and pass gate 312. For example, pass gate 322 may include a first pass transistor 324 having a drain coupled to a first pass-gate input 325, a gate driven by the chopper signal CHP, and a source coupled to the pass-gate output 327. Pass gate 322 may also include a second pass transistor 323 having a drain coupled to a second pass-gate input 326, a gate driven by the inverse chopper signal CHP_BAR, and a source coupled to the pass-gate output 327. Although the individual pass transistors of pass gate 302, pass gate 312, and pass gate 322 are illustrated in FIG. 3A as being implemented by NMOS transistors, the individual pass transistors of pass gates 302, 312, and 322 may alternatively be implemented by, for example, PMOS transistors. In such alternative embodiments utilizing PMOS transistors instead of NMOS transistors, the individual pass transistors of pass gates 302, 312, and 322 may be driven by the opposite signal from among CHP and CHP_BAR than is shown in FIG. 3A to achieve the same functionality as the NMOS-based pass gates shown in FIG. 3A.

As shown in FIG. 3A, pass gate 302 may couple the gate of first transistor 331 to the negative input terminal VIN− of comparator 300 during a first phase when the chopper signal CHP is in a logic-high state, and may alternatively couple the gate of first transistor 331 to the positive input terminal VIN+ of comparator 300 during a second phase when the inverse chopper signal CHP_BAR is in a logic-high state. In a similar manner, pass gate 312 may couple the gate of second transistor 332 to the positive input terminal VIN+ of comparator 300 during the first phase when the chopper signal CHP is in a logic-high state, and may alternatively couple the gate of second transistor 332 to the negative input terminal VIN− of comparator 300 during the second phase when the inverse chopper signal CHP_BAR is in a logic-high state. Pass gate 302 and pass gate 312 may thus alternate the input polarity of input stage 330 during the first phase and the second phase of the chopper signal CHP.

As also shown in FIG. 3A, the chopper circuit may be further configured to alternate the coupling between input stage 330 and output stage 340 during the first phase and the second phase to alternate an output polarity of output stage 340 during the first phase and the second phase. For example, pass gate 322 may couple the gate of output transistor 341 to the drain of second transistor 332 during a first phase when the chopper signal CHP is in a logic-high state, and may alternatively couple the gate of output transistor 341 to the drain of first transistor 331 during a second phase when the inverse chopper signal CHP_BAR is in a logic-high state. Pass gate 322 may thus alternate the output polarity of output stage 340 during the first phase and the second phase.

Offset controller 350 may be configured to adjust an input offset of comparator 300 based on the offset-compensation signal OFFSET_COMP. For example, offset controller 350 may be configured to control first current source 335 and second current source 336 respectively coupled to bias first transistor 331 and second transistor 332 of input stage 330. In some embodiments, first current source 335 and second current source 336 may be configured to match when in a default state and to thereby provide equal bias currents to first transistor 331 and second transistor 332. Based on the offset-compensation signal OFFSET_COMP, offset controller 350 may then adjust first current source 335 and/or second current source 336 to cause the respective currents provided by first current source 335 and/or second current source 336 to be different from each other. The resistance of resistor 333 multiplied by half the difference between the bias currents respectively provided by first current source 335 and second current source 336 will inject an input offset into input stage 330. Accordingly, as described above, offset controller 350 may adjust the input offset of comparator 300 based on the offset-compensation signal OFFSET_COMP, to compensate for an offset detected by offset cancellation circuit 120 as described above with reference to FIGS. 1 and 2.

Although the embodiment shown in FIG. 3A utilizes offset controller 350 to control first current source 335 and second current source 336 to adjust the input offset of comparator 300, any other scheme suitable to adjust the input offset of comparator 300 may be utilized and controlled for example by offset controller 350. For example, in some embodiments, resistor 333 may be omitted and the sources of first transistor 331 and second transistor 332 may be coupled directly together and to a single current source. In such embodiments, the input offset may be adjusted by other suitable techniques. For example, offset controller 350 may be configured to vary the respective bias currents of current source 337 and current source 338 to adjust the input offset of comparator 300. In such example embodiments, current source 337 and current source 338 may include matching output branches of a current mirror as described above, in addition to small adjustable current sources and/or current-mirror outputs configured to controllably adjust the total bias currents provided by current source 337 and current source 338. As another example, offset controller 350 may be configured to adjust a voltage drop directly at the gate of first transistor 331 and/or at the gate of second transistor 332.

Further, although the embodiment of comparator 300 shown in FIG. 3A includes input stage 330 and output stage 340, other embodiments may include other circuit topologies for input stage 330 and output stage 340. Moreover, other embodiments may include additional intermediate stages between input stage 330 and output stage 340. In such other embodiments, the output stage may be considered to be coupled to the input stage via the further intermediate stages.

Figure 3B:
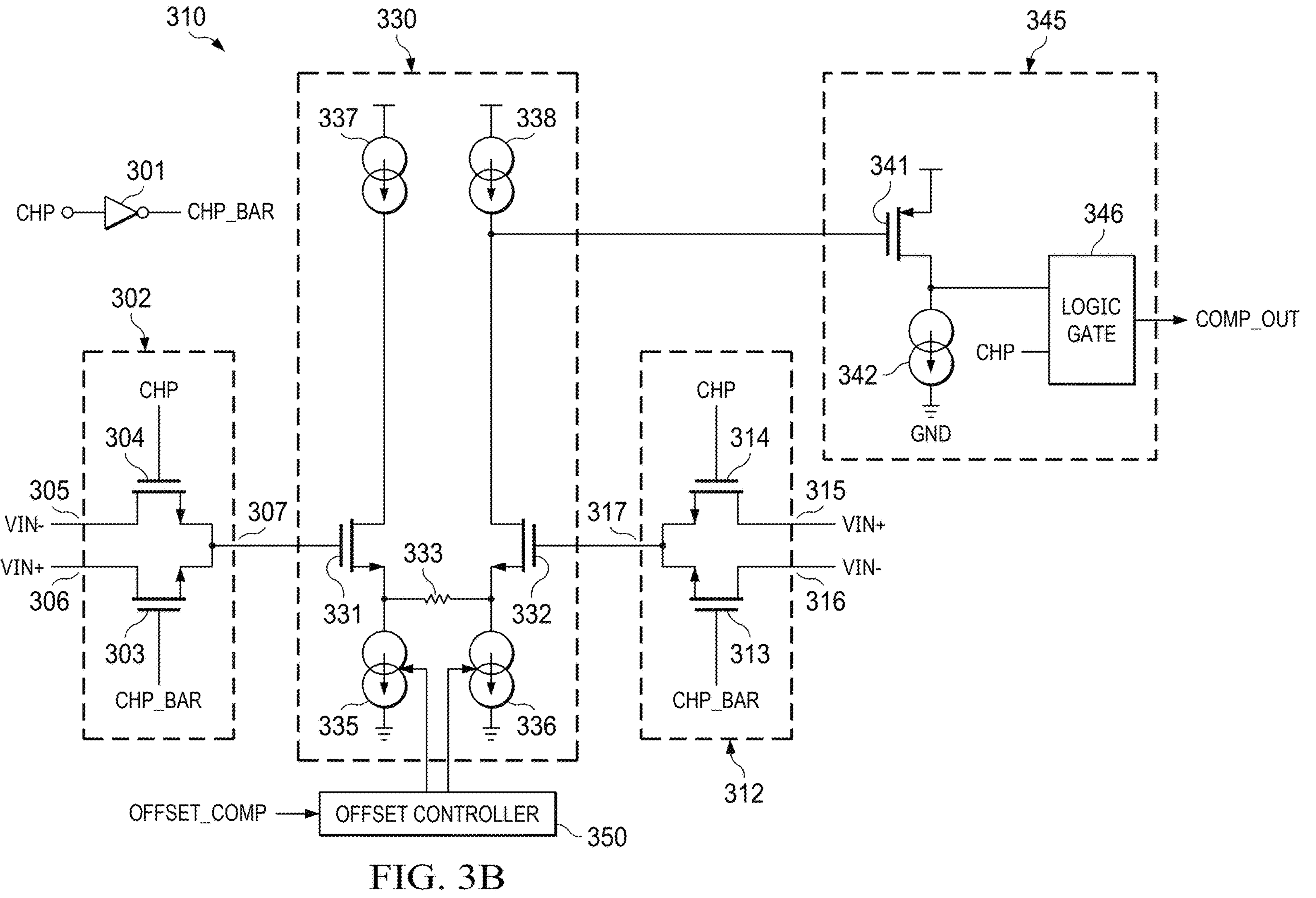
FIG. 3B illustrates a schematic diagram of a comparator in accordance with embodiments of the present disclosure.

FIG. 3B illustrates a schematic diagram of comparator 310 in accordance with embodiments of the present disclosure. Comparator 310 may represent an embodiment of comparator 110 in comparator circuit 100 described above with reference to FIG. 1. Comparator 310 may be implemented in any suitable fashion according to the operation described in the present disclosure.

As shown in FIG. 3B, comparator 310 may include certain components similar to comparator 300 described above with reference to FIG. 3A, including input stage 330, offset controller 350, inverter 301, pass gate 302, and pass gate 312. Each of input stage 330, offset controller 350, inverter 301, pass gate 302, and pass gate 312 may operate in a similar manner as described above for comparator 300.

Comparator 310 may also include output stage 345. Similar to output stage 340 of comparator 300, output stage 345 may include output transistor 341 and current source 342. Output transistor 341 and current source 342 may operate in a similar manner within output stage 345 as described above for output stage 340 of comparator 300. For example, current source 342 may bias output transistor 341, which may further amplify the output of input stage 330. As shown in FIG. 3B, the gate of output transistor 341 may be coupled to the output of input stage 330 at the drain of second transistor 332. Thus, the coupling between input stage 330 and output stage 345 in comparator 310 may remain the same across the first phase and the second phase of the chopper operation.

Output stage 345 may utilize logic gate 346 to logically alternate the output polarity of output stage 345 during the first phase and the second phase of the chopper operation. For example, the drain of output transistor 341 may be coupled to a first logic input of logic gate 346. One of the chopper signal CHP or the inverse chopper signal CHP_BAR may be coupled to a second logic input of logic gate 346. Logic gate 346 may thus utilize a logic operation to alternate the output polarity of output stage 345 across the first phase and the second phase of the chopper operation. For example, in some embodiments where the chopper signal CHP is coupled to the second logic input of logic gate 346, logic gate 346 may be implemented as an XNOR logic gate to generate the comparator output signal COMP_OUT.

In other embodiments, logic gate 346 may be implemented as other types of logic gates suitable to alternate the output polarity of output stage 345 depending on the polarities of the signals coupled to the first logic input and the second logic input of logic gate 346. Further, for the purposes of the present disclosure, logic gate 346 may be considered part of output stage 345 and/or part of the chopper circuitry collectively formed by pass gate 302 and pass gate 312. Accordingly, the chopper circuit including logic gate 346 may be configured to logically alternate the output polarity of the output stage during the first phase and the second phase of the chopper operation.

As shown in both FIGS. 3A and 3B, first transistor 331 and second transistor 332 may be implemented as NMOS transistors. In some applications requiring the comparator to compare low-voltage signals near ground GND, it may be preferable to utilize other types of input stages. For example, in some embodiments, the input stage of comparator 300 or comparator 310 may be implemented with a PMOS-based input stage, or a wide-swing input stage with a combination of both NMOS and PMOS differential pairs. Non-limiting examples of alternative embodiments utilizing a PMOS-based input stage are described below with reference to FIGS. 4A and 4B.

Figure 4A:
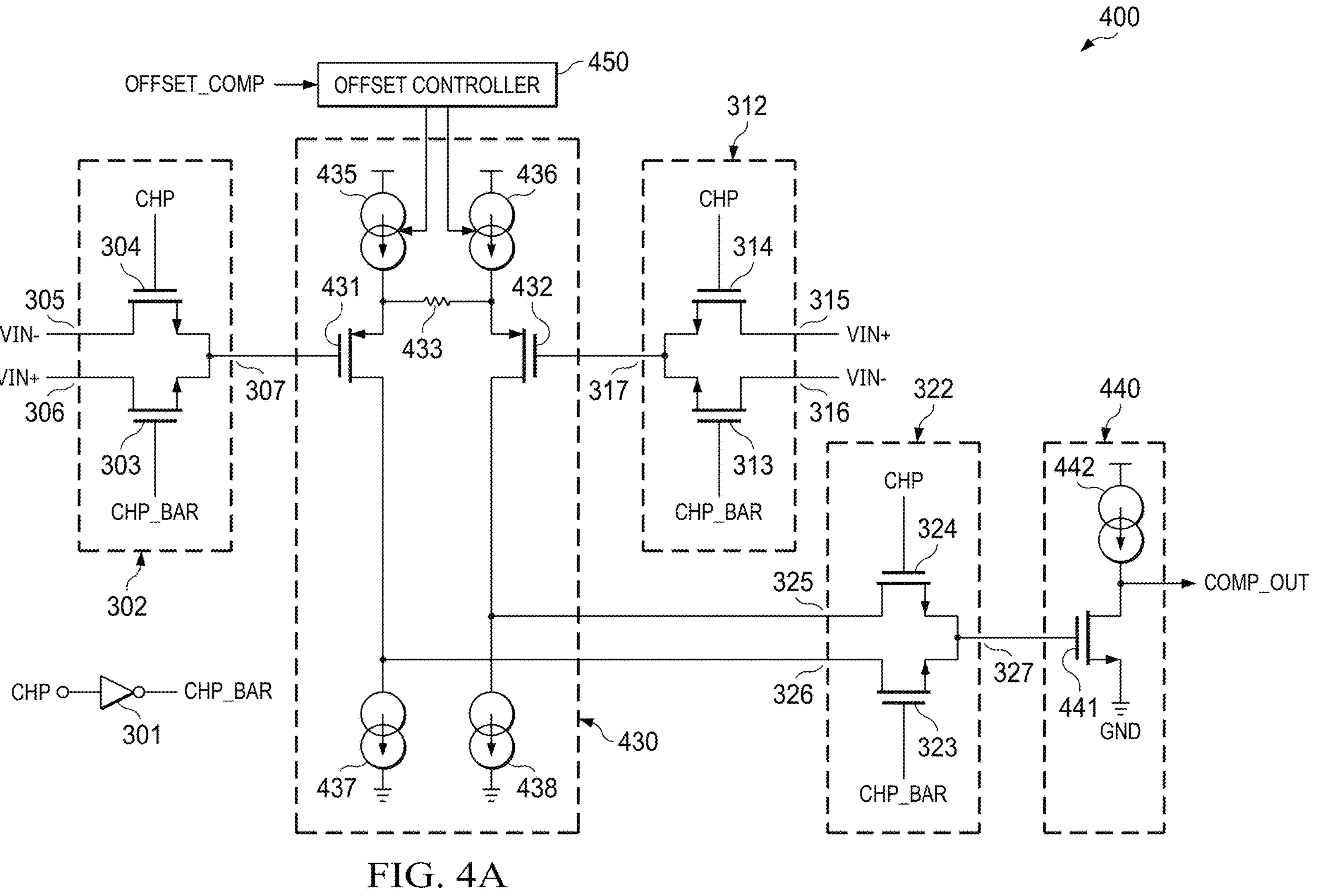
FIG. 4A illustrates a schematic diagram of a comparator in accordance with embodiments of the present disclosure.

FIG. 4A illustrates a schematic diagram of comparator 400 in accordance with embodiments of the present disclosure. Comparator 400 may represent an embodiment of comparator 110 in comparator circuit 100 described above with reference to FIG. 1. Comparator 400 may be implemented in any suitable fashion according to the operation described in the present disclosure. As shown in FIG. 4A, comparator 400 may include input stage 430, output stage 440, offset controller 450, and a chopper circuit collectively formed by pass gates 302, 312, and 322.

Input stage 430 may include first transistor 431 and second transistor 432 configured together as a differential pair. In some embodiments, first transistor 431 and second transistor 432 may be p-type metal-oxide semiconductor field-effect transistors ("p-type MOSFETs" or "PMOS transistors"). As shown in FIG. 4A, the source of first transistor 431 may be coupled to a first current source 435, and the source of second transistor 432 may be coupled to a second current source 436. Resistor 433 may be coupled between the respective sources of first transistor 431 and second transistor 432. Accordingly, and as described in further detail below with reference to offset controller 450, input offset compensation may be injected into input stage 430 based on the resistance value of resistor 433 and the difference between the bias currents provided by first current source 435 and second current source 436. Input stage 430 may further include current source 437 coupled to the drain of first transistor 431 and current source 438 coupled to the drain of second transistor 432. In some embodiments, the bias currents provided by current source 437 and current source 438 may match each other. For example, in some embodiments, current source 437 and current source 438 may be implemented by matching output branches of a current mirror such that the bias current provided by current source 437 matches the bias current provided by current source 438. With first transistor 431 and second transistor 432 being configured together as a differential pair, first transistor 431 and second transistor 432 may amplify any difference in voltage signals received at the respective gates of first transistor 431 and second transistor 432.

Output stage 440 may be coupled to input stage 430 and may be configured to generate the comparator-output signal COMP_OUT. Output stage 440 may include output transistor 441 and current source 442. In some embodiments, output transistor may be an NMOS transistor. As shown in FIG. 4A, output transistor 441 may have a source coupled to ground GND and a drain coupled to current source 442. The gate of output transistor 441 may be coupled, via pass gate 322, to the drain of either first transistor 431 or second transistor 432 depending on the state of pass gate 322. Output stage 440, and output transistor 441 in particular, may thus further amplify the output of input stage 430. In some embodiments, output transistor 441 may generate the comparator-output signal COMP_OUT at its drain.

In addition to input stage 430 and output stage 440, comparator 400 may include a chopper circuit collectively formed by pass gates 302, 312, and 322. The chopper circuit may be configured to alternate an input polarity of input stage 430 during a first phase and a second phase of the chopper signal CHP. The chopper circuit may also be configured to alternate an output polarity of output stage 440 during the first phase and the second phase of the chopper signal CHP.

As shown in FIG. 4A, inverter 301 may invert the chopper signal CHP to create an additional inverse chopper signal CHP_BAR. Pass gates 302, 312, and 322 may utilize CHP and CHP_BAR to selectively pass a signal from one of two pass-gate inputs to the pass-gate output.

As shown in FIG. 4A, pass gate 302 may couple the gate of first transistor 431 to the negative input terminal VIN− of comparator 400 during a first phase when the chopper signal CHP is in a logic-high state, and may alternatively couple the gate of first transistor 431 to the positive input terminal VIN+ of comparator 400 during a second phase when the inverse chopper signal CHP_BAR is in a logic-high state. In a similar manner, pass gate 312 may couple the gate of second transistor 432 to the positive input terminal VIN+ of comparator 400 during the first phase when the chopper signal CHP is in a logic-high state, and may alternatively couple the gate of second transistor 432 to the negative input terminal VIN− of comparator 400 during the second phase when the inverse chopper signal CHP_BAR is in a logic-high state. Pass gate 302 and pass gate 312 may thus alternate the input polarity of input stage 430 during the first phase and the second phase of the chopper operation.

As also shown in FIG. 4A, the chopper circuit may be further configured to alternate the coupling between input stage 430 and output stage 440 during the first phase and the second phase to alternate an output polarity of output stage 440 during the first phase and the second phase. For example, pass gate 322 may couple the gate of output transistor 441 to the drain of second transistor 432 during a first phase when the chopper signal CHP is in a logic-high state, and may alternatively couple the gate of output transistor 441 to the drain of first transistor 431 during a second phase when the inverse chopper signal CHP_BAR is in a logic-high state. Pass gate 322 may thus alternate the output polarity of output stage 440 during the first phase and the second phase.

Offset controller 450 may be configured to adjust an input offset of comparator 400 based on the offset-compensation signal OFFSET_COMP. For example, offset controller 450 may be configured to control first current source 435 and second current source 436 respectively coupled to bias first transistor 431 and second transistor 432 of input stage 430. In some embodiments, first current source 435 and second current source 436 may be configured to match when in a default state and to thereby provide equal bias currents to first transistor 431 and second transistor 432. Based on the offset-compensation signal OFFSET_COMP, offset controller 450 may then adjust first current source 435 and/or second current source 436 to cause the respective currents provided by first current source 435 and/or second current source 436 to be different from each other. The resistance of resistor 433 multiplied by the difference between the bias currents respectively provided by first current source 435 and second current source 436 will inject an input offset into input stage 430. Accordingly, as described above, offset controller 450 may adjust the input offset of comparator 400 based on the offset-compensation signal OFFSET_COMP, to compensate for an offset detected by offset cancellation circuit 120 as described above with reference to FIGS. 1 and 2.

Although the embodiment shown in FIG. 4A utilizes offset controller 450 to control first current source 435 and second current source 436 to adjust the input offset of comparator 400, any other scheme suitable to adjust the input offset of comparator 400 may be utilized and controlled for example by offset controller 450. For example, in some embodiments, resistor 433 may be omitted and the sources of first transistor 431 and second transistor 432 may be coupled directly together and to a single current source. In such embodiments, the input offset may be adjusted by other suitable techniques. For example, offset controller 450 may be configured to vary the respective bias currents of current source 437 and current source 438 to adjust the input offset of comparator 400. In such example embodiments, current source 437 and current source 438 may include matching output branches of a current mirror as described above, in addition to small adjustable current sources and/or current-mirror outputs configured to controllably adjust the total bias currents provided by current source 437 and current source 438. As another example, offset controller 450 may be configured to adjust a voltage drop directly at the gate of first transistor 431 and/or at the gate of second transistor 432.

Further, although the embodiment of comparator 400 shown in FIG. 4A includes input stage 430 and output stage 440, other embodiments may include other circuit topologies for input stage 430 and output stage 440. Moreover, other embodiments may include additional intermediate stages between input stage 430 and output stage 440. In such other embodiments, the output stage may be considered to be coupled to the input stage via the further intermediate stages.

Figure 4B:
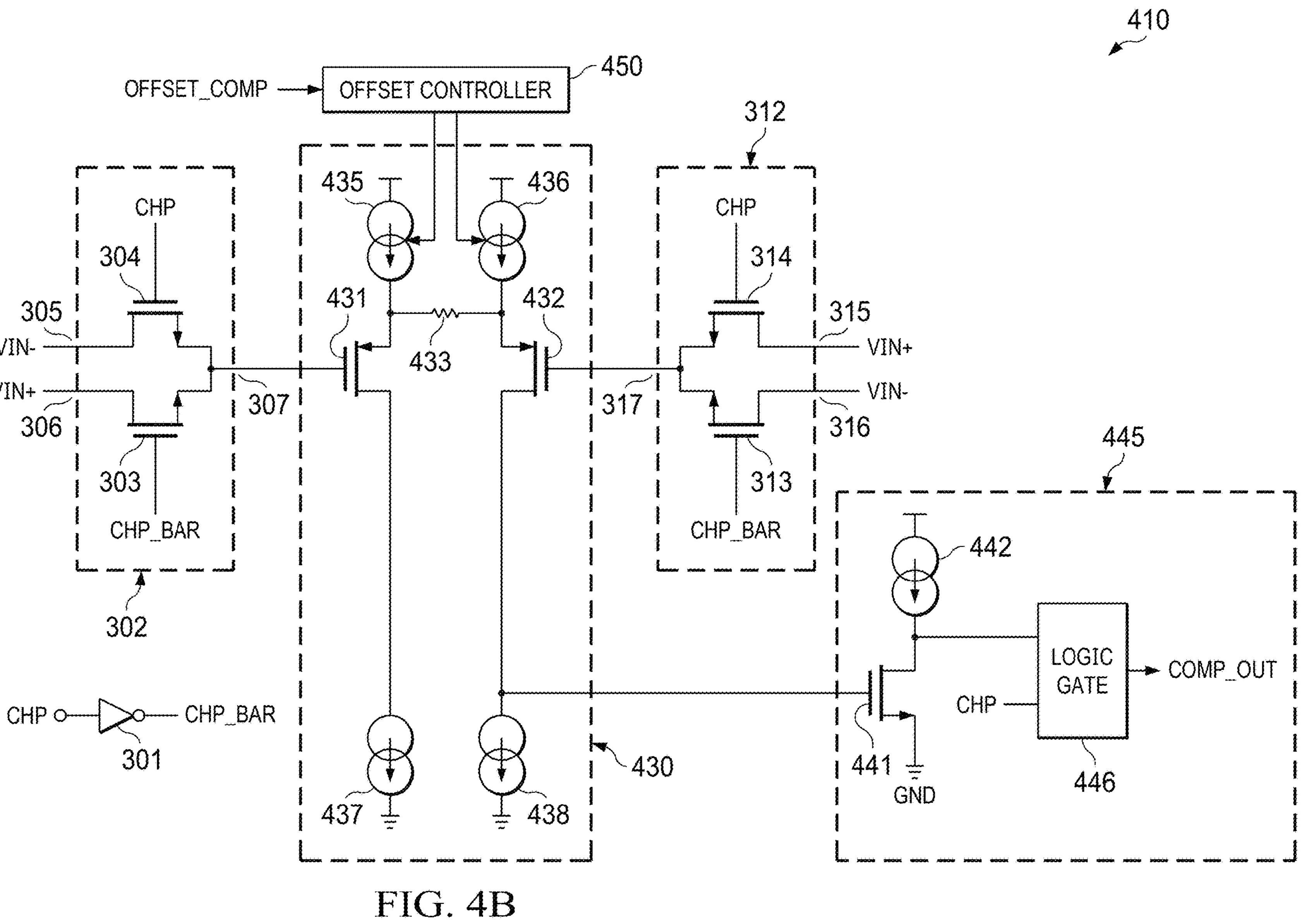
FIG. 4B illustrates a schematic diagram of a comparator in accordance with embodiments of the present disclosure.

FIG. 4B illustrates a schematic diagram of comparator 410 in accordance with embodiments of the present disclosure. Comparator 410 may represent an embodiment of comparator 110 in comparator circuit 100 described above with reference to FIG. 1. Comparator 410 may be implemented in any suitable fashion according to the operation described in the present disclosure.

As shown in FIG. 4B, comparator 410 may include certain components similar to comparator 400 described above with reference to FIG. 4A, including input stage 430, offset controller 450, inverter 301, pass gate 302, and pass gate 312. Each of input stage 430, offset controller 450, inverter 301, pass gate 302, and pass gate 312 may operate in a similar manner as described above for comparator 400.

Comparator 410 may also include output stage 445. Similar to output stage 440 of comparator 400, output stage 445 may include output transistor 441 and current source 442. Output transistor 441 and current source 442 may operate in a similar manner within output stage 445 as described above for output stage 440 of comparator 400. For example, current source 442 may bias output transistor 441, which may further amplify the output of input stage 430. As shown in FIG. 4B, the gate of output transistor 441 may be coupled to the output of input stage 430 at the drain of second transistor 432. Thus, the coupling between input stage 430 and output stage 445 in comparator 410 may remain the same across the first phase and the second phase of the chopper operation.

Output stage 445 may utilize logic gate 446 to logically alternate the output polarity of output stage 445 during the first phase and the second phase of the chopper operation. For example, the drain of output transistor 441 may be coupled to a first logic input of logic gate 446. One of the chopper signal CHP or the inverse chopper signal CHP_BAR may be coupled to a second logic input of logic gate 446. Logic gate 446 may thus utilize a logic operation to alternate the output polarity of output stage 445 across the first phase and the second phase of the chopper operation. For example, in some embodiments where the chopper signal CHP is coupled to the second logic input of logic gate 446, logic gate 446 may be implemented as an XNOR logic gate to generate the comparator output signal COMP_OUT. In other embodiments, logic gate 446 may be implemented as other types of logic gates suitable to alternate the output polarity of output stage 445 depending on the polarities of the signals coupled to the first logic input and the second logic input of logic gate 446. Further, for the purposes of the present disclosure, logic gate 446 may be considered part of output stage 445 and/or part of the chopper circuit collectively formed by pass gate 302 and pass gate 312. Accordingly, the chopper circuit including logic gate 446 may be configured to logically alternate the output polarity of the output stage during the first phase and the second phase of the chopper operation.

Figure 5:
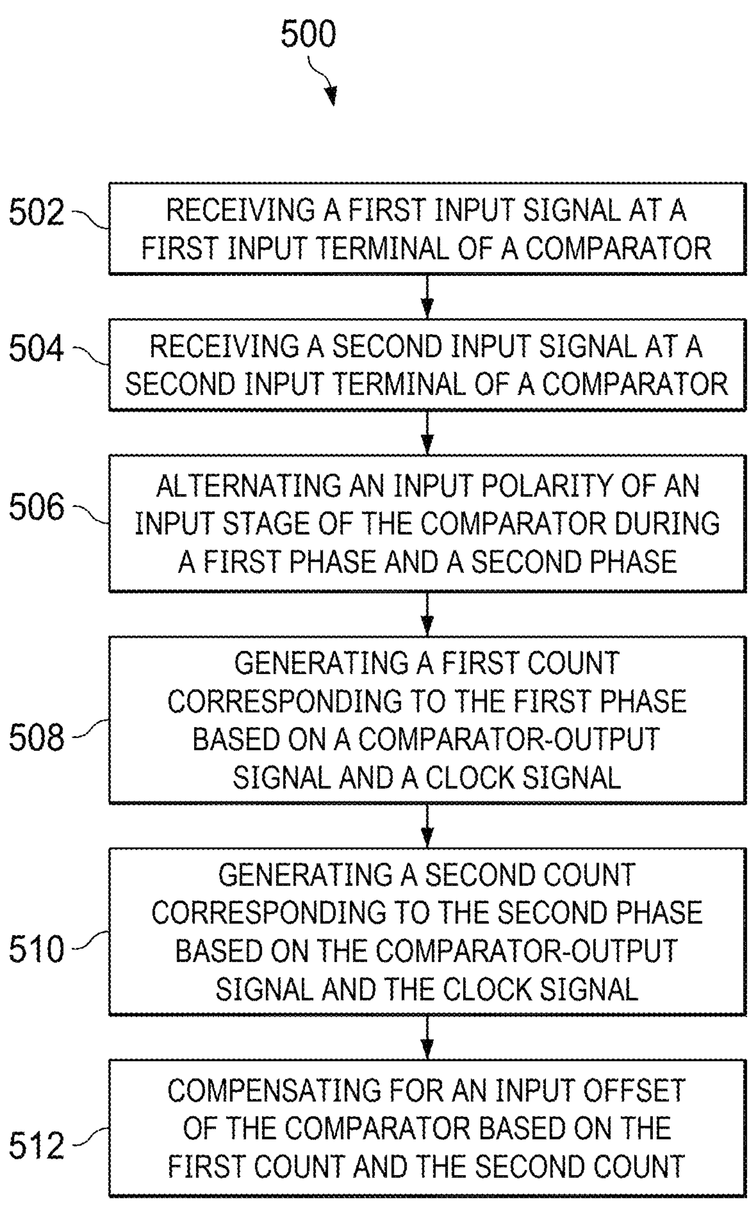
FIG. 5 illustrates operation of an example method in accordance with embodiments of the present disclosure.

FIG. 5 illustrates operation of an example method 500 in accordance with embodiments of the present disclosure. Method 500 may be performed by any suitable mechanism, such as comparator circuit 100, comparator 110, comparator 300, comparator 310, comparator 400, comparator 410, offset cancellation circuit 120, and/or any suitable combination thereof. Method 500 may be performed with fewer or more steps than shown in FIG. 5. Moreover, steps of method 500 may be omitted, repeated, performed in parallel, performed in a different order than shown in FIG. 5, or performed recursively. One or more steps of method 5, although shown in an order, may be performed at the same time or in a re-ordered manner.

Step 502 may include receiving a first input signal at a first input terminal of a comparator. Step 504 may include receiving a second input signal at a second input terminal of a comparator. For example, comparator 110 may receive a first input signal in the form of input signal VSIG at a first input terminal, which may be for example a positive input terminal. Comparator 110 may also receive a second input signal in the form of reference signal VREF at its second input terminal, which may for example be a negative input terminal.

Step 506 may include alternating an input polarity of an input stage of the comparator during a first phase and a second phase. For example, as described above with reference to FIG. 1 and FIG. 2, a comparator such as comparator 110 may receive a chopper signal CHP to control a chopper circuit internal to comparator 110. And as described above with reference to FIGS. 3A-4B, the chopper circuit may be configured to alternate, during a first phase and a second phase of the chopper signal CHP, an input polarity of an input stage internal to comparator 110 as well as an output polarity of an output stage internal to comparator 110. With regard to alternating the output polarity, some embodiments may include alternating a coupling between the input stage of the comparator and the output stage of the comparator during the first phase and the second phase to alternate an output polarity of the output stage during the first phase and the second phase. Other embodiments may include logically alternating an output polarity of an output stage during the first phase and the second phase.

Step 508 may include generating a first count corresponding to the first phase based on a comparator-output signal and a clock signal. And step 510 may include generating a second count corresponding to the second phase based on the comparator-output signal and the clock signal. For example, as described above with reference to FIG. 1 and FIG. 2, counter circuit 122 may be coupled to receive the comparator-output signal COMP_OUT and a clock signal CLK. In some embodiments, counter circuit 122 may be configured to generate a first count during the first phase, for example when the chopper signal CHP is high, based on the comparator-output signal COMP_OUT and the clock signal CLK. Likewise, counter circuit 122 may also be configured to generate a second count during the second phase, for example when CHP is low, based on the comparator-output signal COMP_OUT and the clock signal CLK.

Step 512 may include compensating for an input offset of the comparator based on the first count and the second count. For example, as described above with reference to FIG. 1 and FIG. 2, at least one of the first input signal and the second input signal may be a cyclic signal. Further, the first phase and the second phase described above may have a phase frequency aligned to the cyclic frequency of the cyclic signal. Offset cancellation circuit 120 may thus utilize the cyclic nature of the inputs of comparator 110 to measure a magnitude of the offset present in comparator 110 and to generate an offset-compensation signal OFFSET_COMP accordingly. For example, the difference between the first count and the second count may be proportional to the input offset of comparator 110. Thus, to compensate for the input offset of comparator 110, compensation circuit 124 may generate an offset-compensation signal OFFSET_COMP that may adjust the input offset of comparator 110 at a level that is proportional to the difference between the first count and the second count.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

What is claimed is:

1. A comparator circuit, comprising:
- a comparator including:
  - a first input terminal configured to receive a first input signal;
  - a second input terminal configured to receive a second input signal; and
  - a chopper circuit configured to alternate an input polarity of an input stage during a first phase and a second phase;
- a counter circuit coupled to receive a comparator-output signal and a clock signal, the counter circuit configured to generate a first count during the first phase and to generate a second count during the second phase based on the comparator-output signal and the clock signal; and
- a compensation circuit configured to generate an offset-compensation signal based on the first count and the second count; and
- wherein the comparator further includes an offset controller configured to adjust an input offset of the comparator based on the offset-compensation signal.

2. The comparator circuit of claim 1, wherein at least one of the first input signal and the second input signal is a cyclic signal.

3. The comparator circuit of claim 2, wherein the first phase and the second phase have a phase frequency aligned to a cyclic frequency of the cyclic signal.

4. The comparator circuit of claim 1, wherein the offset-compensation signal is generated based on a difference between the first count and the second count.

5. The comparator circuit of claim 4, wherein the offset-compensation signal adjusts the input offset of the comparator at a level that is proportional to the difference between the first count and the second count.

6. The comparator circuit of claim 1, wherein the clock signal has a clock frequency that is higher than a phase frequency of the first phase and the second phase by a ratio of at least 100:1.

7. The comparator circuit of claim 1, wherein the counter circuit is further configured to average the first count over two or more repeated first phases to generate a first-count average.

8. The comparator circuit of claim 1, wherein the counter circuit is further configured to average the second count over two or more repeated second phases to generate a second-count average.

9. The comparator circuit of claim 1, wherein:
- the input stage includes a first transistor and a second transistor configured together as a differential pair; and
- the comparator further includes an output stage coupled to the input stage and configured to generate the comparator-output signal.

10. The comparator circuit of claim 9, wherein the chopper circuit is further configured to alternate the coupling between the input stage and the output stage during the first phase and the second phase to alternate an output polarity of the output stage during the first phase and the second phase.

11. The comparator circuit of claim 9, wherein the chopper circuit is further configured to logically alternate an output polarity of the output stage during the first phase and the second phase.

12. The comparator circuit of claim 9, wherein the offset controller is configured to control a first current source and a second current source respectively coupled to bias the first transistor and the second transistor of the input stage.

13. An offset-compensation system, comprising:
- a comparator including:
  - a first input terminal configured to receive a first input signal;
  - a second input terminal configured to receive a second input signal;
  - an input stage including a first transistor and a second transistor configured together as a differential pair;
  - an output stage coupled to the input stage and configured to generate a comparator-output signal; and
  - a chopper circuit configured to alternate an input polarity of the input stage and an output polarity of the output stage during a first phase and a second phase;
- a counter circuit coupled to receive the comparator-output signal and a clock signal, the counter circuit configured to generate a first count during the first phase and to generate a second count during the second phase based on the comparator-output signal and the clock signal; and a compensation circuit configured to generate an offset-compensation signal based on the first count and the second count; and wherein the comparator further includes an offset controller configured to adjust an input offset of the comparator based on the offset-compensation signal.

14. The offset-compensation system of claim 13, wherein:

at least one of the first input signal and the second input signal is a cyclic signal; and the first phase and the second phase have a phase frequency aligned to a cyclic frequency of the cyclic signal.

15. The offset-compensation system of claim 13, wherein the offset-compensation signal adjusts the input offset of the comparator at a level that is proportional to a difference between the first count and the second count.

16. A method, comprising:

receiving a first input signal at a first input terminal of a comparator;

receiving a second input signal at a second input terminal of the comparator;

alternating an input polarity of an input stage of the comparator during a first phase and a second phase;

generating a first count corresponding to the first phase based on a comparator-output signal and a clock signal;

generating a second count corresponding to the second phase based on the comparator-output signal and the clock signal; and compensating for an input offset of the comparator based on the first count and the second count.

17. The method of claim 16, wherein:

at least one of the first input signal and the second input signal is a cyclic signal; and the first phase and the second phase have a phase frequency aligned to a cyclic frequency of the cyclic signal.

18. The method of claim 16, wherein the input offset of the comparator is compensated based on a difference between the first count and the second count.

19. The method of claim 16, further comprising alternating a coupling between the input stage of the comparator and an output stage of the comparator during the first phase and the second phase to alternate an output polarity of the output stage during the first phase and the second phase.

20. The method of claim 16, further comprising logically alternating an output polarity of an output stage during the first phase and the second phase.

* * * * *